(12) United States Patent
Todorov

(10) Patent No.: US 8,701,519 B2
(45) Date of Patent: *Apr. 22, 2014

(54) ROBOT WITH BELT-DRIVE SYSTEM

(75) Inventor: Alexander Todorov, Santa Clara, CA (US)

(73) Assignee: Genmark Automation, Inc., Milpitas, CA (US)

(*) Notice: Subject to any disclaimer, the term of this patent is extended or adjusted under 35 U.S.C. 154(b) by 973 days.

This patent is subject to a terminal disclaimer.

(21) Appl. No.: 11/478,005

(22) Filed: Jun. 28, 2006

(65) Prior Publication Data

US 2008/0121064 A1    May 29, 2008

(51) Int. Cl.
*B25J 17/00*    (2006.01)
*B25J 17/02*    (2006.01)
*B66C 23/00*    (2006.01)
*B25J 18/00*    (2006.01)

(52) U.S. Cl.
USPC .......... 74/490.05; 74/490.07; 74/490.01; 901/15; 901/21; 414/744.3

(58) Field of Classification Search
USPC ............ 74/490, 490.01, 490.02, 490.04, 74/490.05, 490.07; 901/15, 21; 414/744.1–744.6; 187/222, 224; 474/61, 62
See application file for complete search history.

(56) References Cited

U.S. PATENT DOCUMENTS

| | | | |
|---|---|---|---|
| 1,925,036 A * | 8/1933 | Gorton | 474/62 |
| 3,575,301 A * | 4/1971 | Panissidi | 901/21 |
| 4,872,799 A | 10/1989 | Fisher, Jr. | |
| 4,946,337 A | 8/1990 | Tonai et al. | |
| 4,978,274 A * | 12/1990 | de Groot | 414/744.3 |
| 5,085,556 A | 2/1992 | Ohtomi | |
| 5,100,284 A * | 3/1992 | Boisseau | 414/744.3 |
| 5,178,512 A * | 1/1993 | Skrobak | 414/744.5 |
| 5,476,358 A | 12/1995 | Costa | |
| 5,741,113 A | 4/1998 | Bacchi et al. | |
| 5,789,890 A | 8/1998 | Genov et al. | |
| 5,904,466 A | 5/1999 | Miller et al. | |
| 6,006,865 A * | 12/1999 | Ammon | 187/266 |
| 6,037,733 A * | 3/2000 | Genov et al. | 901/15 |
| 6,121,743 A | 9/2000 | Genov et al. | |
| 6,190,114 B1 | 2/2001 | Ogawa et al. | |

(Continued)

OTHER PUBLICATIONS

International Search Report, Application No. PCT/US07/17728, dated Jul. 18, 2008.

(Continued)

*Primary Examiner* — Daniel Yabut
(74) *Attorney, Agent, or Firm* — Nixon Peabody LLP

(57) ABSTRACT

A substrate handling robot having a robot body and a robot arm with an end effector is configured to exhibit angular (θ), radial (R) and Z motion. A pair of coaxial shafts link the robot arm to respective motors dedicated to angular (θ) and radial (R) motions. The motors are stationarily mounted with respect to the robot body. The shafts are rotatably supported by a floating platform which is motivated in the Z direction by a third motor also stationarily mounted with respect to the robot body. The third motor is coupled to the platform by a Z motion linkage. The first and second motors are coupled to the coaxial shafts by angular and radial motion linkages each of which includes primary and secondary timing belts whose relative motions are synchronized with the Z motion linkage to achieve controllable independent angular (θ), radial (R) and Z motions in a simple, light-weight package.

15 Claims, 14 Drawing Sheets

(56) References Cited

U.S. PATENT DOCUMENTS

| | | |
|---|---|---|
| 6,330,837 B1 | 12/2001 | Charles et al. |
| 6,382,039 B1 | 5/2002 | Choi |
| 6,489,741 B1 * | 12/2002 | Genov et al. .................. 318/561 |
| 6,601,468 B2 | 8/2003 | Grover et al. |
| 6,632,065 B1 | 10/2003 | Cameron et al. |
| 6,634,851 B1 | 10/2003 | Bonora et al. |
| 6,737,826 B2 | 5/2004 | Gilchrist |
| 6,826,977 B2 | 12/2004 | Grover et al. |
| 7,007,566 B2 | 3/2006 | Norum |
| 7,040,456 B2 | 5/2006 | Ach et al. |
| 8,220,354 B2 | 7/2012 | Todorov |
| 2002/0078778 A1 | 6/2002 | Grover et al. |
| 2002/0114690 A1 | 8/2002 | Ishigame |
| 2003/0159535 A1 | 8/2003 | Grover et al. |
| 2004/0076505 A1 | 4/2004 | Kinnard et al. |
| 2008/0041183 A1 | 2/2008 | Todorov |
| 2012/0321427 A1 | 12/2012 | Todorov |

OTHER PUBLICATIONS

International Search Report, Application No. PCT/US07/14495, dated Jul. 22, 2008.
Office Action, dated Apr. 28, 2010, in US Appl. No. 11/520,982.
Office Action in U.S. Appl. No. 11/520,982, mailed Sep. 20, 2011.
Office Action in U.S. Appl. No. 11/520,982, mailed Apr. 29, 2011.
Office Action in U.S. Appl. No. 11/520,982, mailed Oct. 22, 2010.
Office Action in U.S. Appl. No. 11/520,982, mailed Aug. 25, 2009.
U.S. Office Action in U.S. Appl. No. 13/535,120 mailed on Apr. 22, 2013.
Notice of Allowance in U.S. Appl. No. 11/520,982, mailed May 25, 2012.
Office Action in U.S. Appl. No. 13/535,120, mailed Dec. 28, 2012.
Office Action in U.S. Appl. No. 13/535,120 mailed Aug. 26, 2013.
Notice of Allowance in U.S. Appl. No. 13/535,120, mailed Oct. 31, 2013.

* cited by examiner

ROBOT WITH BELT-DRIVE SYSTEM

RELATED APPLICATIONS

This application is the parent application for child application Ser. No. 11/520,982, now U.S. Pat. No. 8,220,354 B2, which was filed as a continuation-in-part of the instant application.

BACKGROUND OF THE INVENTION

1. Field of the Invention

The invention relates to robots used for substrate transport in semiconductor processing.

2. Description of the Related Art

Robots are commonly used in semiconductor processing environments, in order to transport substrates such as wafers to and from storage locations or various processing stations. The highly repetitive nature of the motions involved and the speeds required for high throughput make robots ideal candidates for these tasks. The types of motions of which these types of robots are capable vary. Typically, a robot having a robot body and robot arm extending from the robot body will exhibit angular (θ), radial (R) and Z motions in a cylindrical coordinate system. Angular motion refers to rotation of the robot arm about a primary axis at which it is pivotably coupled to the robot body. Radial motion is extension/retraction motion of the robot arm to and from the primary axis. Z motion is elevation of the robot arm (up-down) with respect to the robot body. Details of operation of such robots are described in U.S. Pat. No. 5,789,890, entitled "ROBOT HAVING MULTIPLE DEGREES OF FREEDOM (Genov et al.), incorporated herein by reference in its entirety.

Issues that are of concern in these types of robots include weight, size, complexity, and range. The present invention seeks to address one or more of these issues, to thereby improve factors such as robot performance, reliability, and throughput, and to increase longevity and reduce costs of robot manufacture and maintenance.

BRIEF SUMMARY OF THE INVENTION

In accordance with one aspect of the invention, there is provided a robot that includes a robot arm and a robot body. Also included is a floating Z platform mounted for motion in a Z direction in the robot body, a shaft coupled to the robot arm and to the floating Z platform, the shaft being rotatable about a primary axis and movable with the floating Z platform, a first motor configured to impart Z motion to the floating Z platform and to the shaft, a primary timing belt stationarily mounted in the robot body, a second motor configured to rotate the primary timing belt, and a secondary timing belt coupled to the primary timing belt and to the shaft to thereby transfer motion of the primary timing belt to the robot arm by way of said shaft.

In accordance with a further aspect of the invention, there is provided an assembly for providing a robot having a robot arm and a robot body with Z motion and at least one of R and θ motions. The assembly includes a floating platform configured for translation relative to the robot body in a first direction, a shaft coupled to the robot arm and supported by the floating platform, the shaft being translatable with the floating platform in the first direction and being axially rotatable about a primary axis extending in the first direction, a first motor mounted stationarily relative to the robot body such that translation of the floating platform and shaft occurs relative to the first motor, a second motor mounted stationarily relative to the body such that translation of the floating platform and shaft occurs relative to the second motor, a first linkage coupling the first motor to the floating platform such that the first motor is capable of motivating the translation of the floating platform and the shaft, and a second linkage coupling the second motor to the shaft such that the second motor is capable of motivating the axial rotation of the shaft. The second linkage includes a primary timing belt stationarily mounted relative to the robot body, and a motion conversion assembly translatable with the floating platform and the shaft, the motion conversion assembly including a secondary timing belt coupled to the primary timing belt.

In accordance with a further aspect of the invention, there is provided a method for enabling a robot having a robot arm and a robot body to undergo Z motion and at least one of radial (R) and angular (θ) motions. The method includes coupling motion of a first motor that is stationarily mounted with respect to the robot body to the robot arm by way of a shaft that is mounted for axial translation along a primary axis in response to the first motor motion, and coupling motion of a second motor that is stationarily mounted with respect to the robot body to the robot arm by way of the shaft, the shaft being mounted for rotation about the primary axis in response to the second motor motion. The coupling of motion of a second motor includes, in response to rotation of the second motor, rotating a primary timing belt that is stationarily mounted with respect to the robot body, and converting the rotation of the primary timing belt to the rotation of the shaft about the primary axis using a motion conversion assembly that is configured to translate axially with the shaft.

In accordance with a further aspect of the invention, there is provided an apparatus for enabling a robot having a robot arm and a robot body to undergo Z motion and at least one of radial (R) and angular (θ) motions. The apparatus includes means for coupling motion of a first motor that is stationarily mounted with respect to the robot body to the robot arm by way of a shaft that is mounted for axial translation along a primary axis in response to said the motor motion, and means for coupling motion of a second motor that is stationarily mounted with respect to the robot body to the robot arm by way of the shaft, the shaft being mounted for rotation about the primary axis in response to the second motor motion. The means for coupling motion of a second motor is operative to, in response to rotation of the second motor, rotate a primary timing belt that is stationarily mounted with respect to the robot body, and convert the rotation of the primary timing belt to the rotation of the shaft about the primary axis using a motion conversion assembly that is configured to translate axially with the shaft.

In accordance with a further aspect of the invention, there is provided a method for providing motion to a robot arm in a robot having a Z motion linkage capable of imparting Z motion to a robot arm, a robot body angular (θ) motion linkage capable of imparting angular motion to the robot arm, and a robot body radial (R) motion linkage capable of imparting radial motion to the robot arm. The method includes actuating a first motor coupled to the robot arm by way of the Z motion linkage, actuating a second motor coupled to the robot arm by way of the robot body angular (θ) motion linkage, actuating a third motor coupled to the robot arm by way of the robot body radial (R) motion linkage, and synchronizing the first, second and third motors such that the robot arm undergoes Z motion while maintaining fixed angular (θ) and radial (R) positions.

In accordance with a further aspect of the invention, there is provided a computer readable medium containing a program that causes a robot having a Z motion linkage capable of imparting Z motion to a robot arm, a robot body angular (θ) motion linkage capable of imparting angular motion to the robot arm, and a robot body radial (R) motion linkage capable of imparting radial motion to the robot arm, to undergo motion based on a procedure that includes actuation of a first motor coupled to the robot arm by way of the Z motion linkage, actuation of a second motor coupled to the robot arm by way of the robot body angular (θ) motion linkage, actuation of a third motor coupled to the robot arm by way of the robot body radial (R) motion linkage, and synchronization of the first, second and third motors such that the robot arm undergoes Z motion while maintaining fixed angular (θ) and radial (R) positions.

Advantages provided by some or all of the invention aspects disclosed herein include light weight due to the types and arrangement of linkages and components. This minimizes robot weight and reduces component inertia, thereby allowing for greater operational speeds, and reduced wear. Another advantage is the ability to achieve angular rotation of the robot arm that is "endless"—that is, greater than 360 degrees, without the hinderance of cables or the like that would twist and limit rotation. Other advantages will become evident from a reading of the description below.

BRIEF DESCRIPTION OF THE SEVERAL VIEWS OF THE DRAWINGS

Many advantages of the present invention will be apparent to those skilled in the art with a reading of this specification in conjunction with the attached drawings, wherein like reference numerals are applied to like elements, and wherein.

DETAILED DESCRIPTION OF THE INVENTION

Embodiments of the present invention are described herein in the context of robots used for substrate transport in semiconductor processing. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
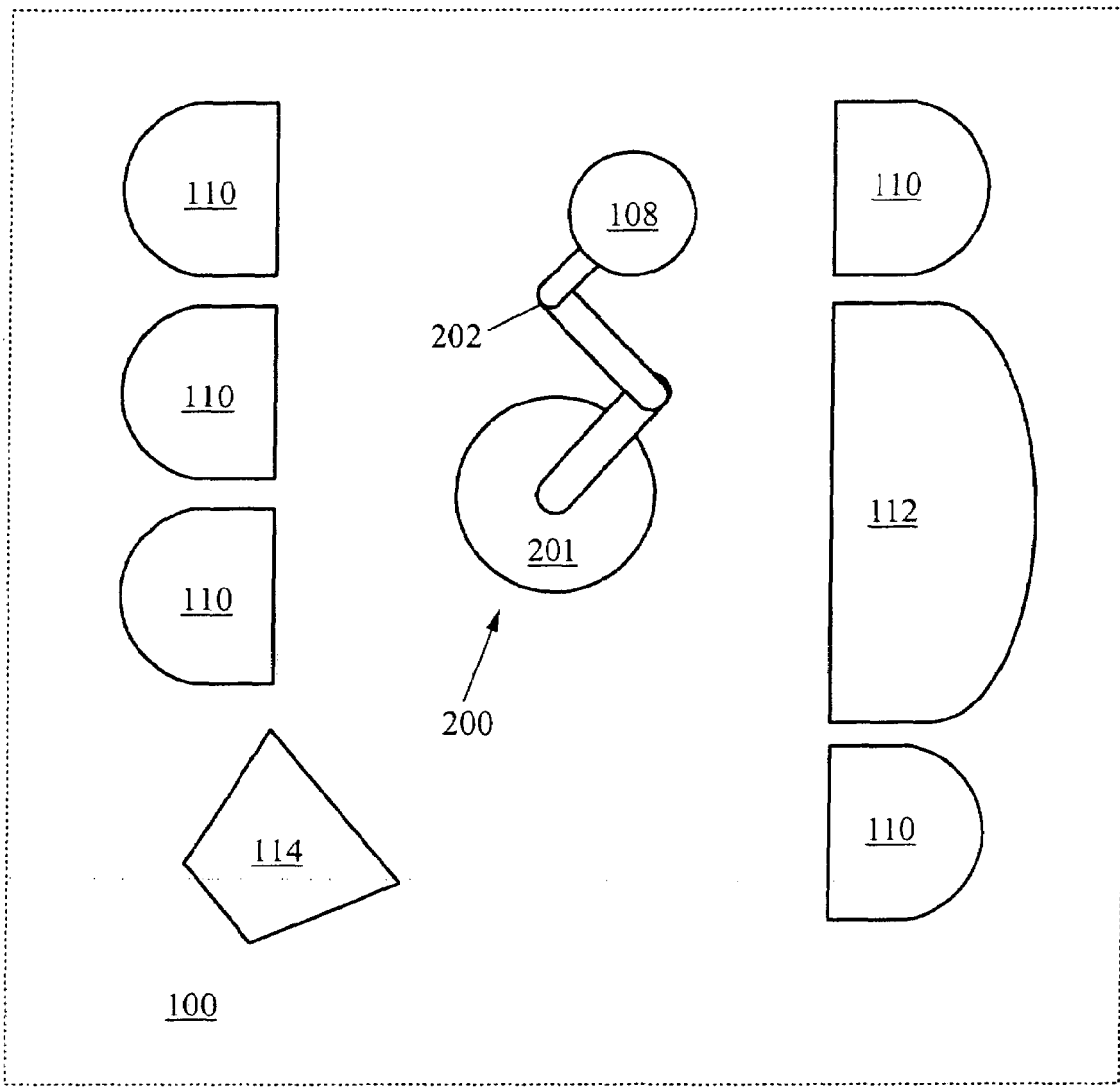
FIG. 1 is a top plan view of a semiconductor processing environment including a robot.

FIG. 1 is a top plan view of a semiconductor processing environment 100, typically exhibiting clean room conditions. A robot 200 having a robot body 201 and a robot arm 202 is disposed between two rows of stations 106. The robot arm 202 is configured to carry a semiconductor wafer 108, for example a standard 300 mm wafer, between the stations 106. Other substrates may also be similarly transported, for example 200 mm wafers, flat panel displays, and so forth. The stations 106 include for example one or more storage cassettes 110 in which the substrates—that is, the 300 mm wafers in this example—are stacked. Additional stations, such as CVD (chemical vapor deposition) stations 112, may be provided, in which various fabrication procedures take place. Also included is a prealignment station 114 at which the wafer 108 may be deposited such that its orientation can be determined and/or adjusted. Alignment may also be conducted by the robot arm itself if suitably equipped.

Figure 2:
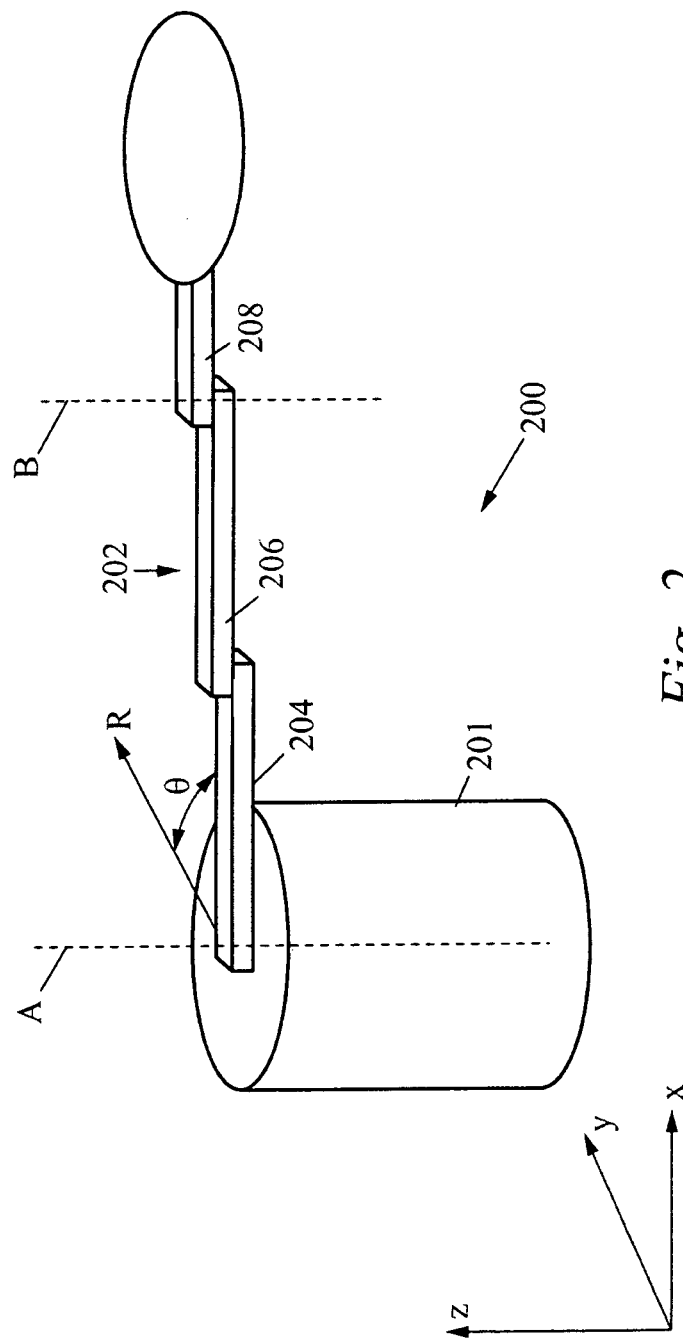
FIG. 2 is a schematic view of the robot of FIG. 1

FIG. 2 is a more detailed view of robot 200 of FIG. 1. Arm 202 comprises a plurality of links 204, 206 and 208, the distalmost of which, 208, engages the substrate to be transported and is herein referred to as the end effector. Robot 200 exhibits R, θ and Z motion as defined in a polar coordinate system, with the R motion being generally radial motion of the distalmost link (that is, end effector 208) from primary axis A of the robot 200. θ motion is rotation of arm 202 about the primary axis A. Z motion is motion of arm 202 along primary axis A (that is, "up-down" motion). In addition, end effector 208 may exhibit yaw (Y) motion, which is defined as rotation about an end effector or yaw axis B which is substantially parallel to primary axis A. While not detailed herein, additional motions, such roll and pitch of the end effector 208, and tilting of the robot 200 relative to the Z axis, are also contemplated.

Figure 3:
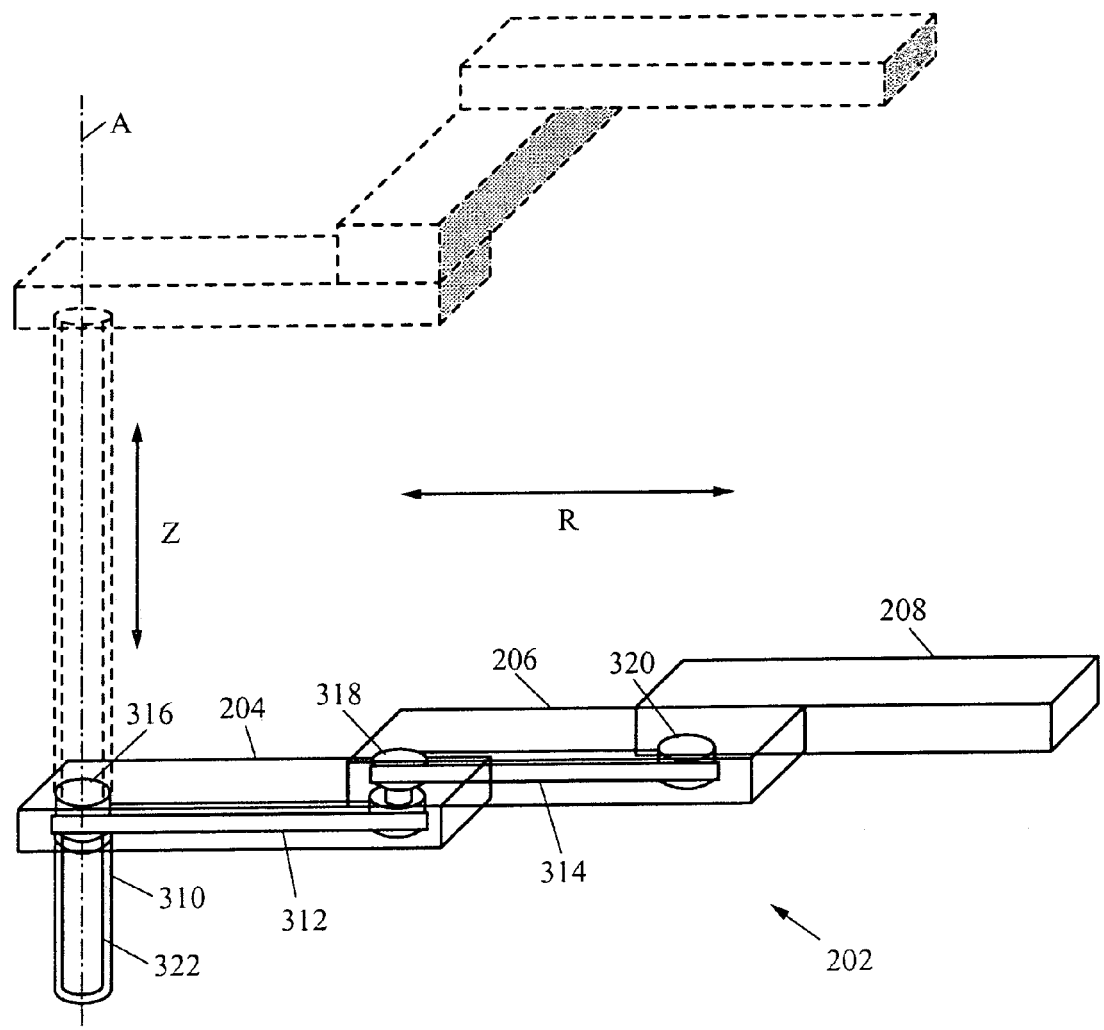
FIG. 3 is a schematic view detailing the motions of the robot arm of the robot of FIG. 2.
Figure 4:
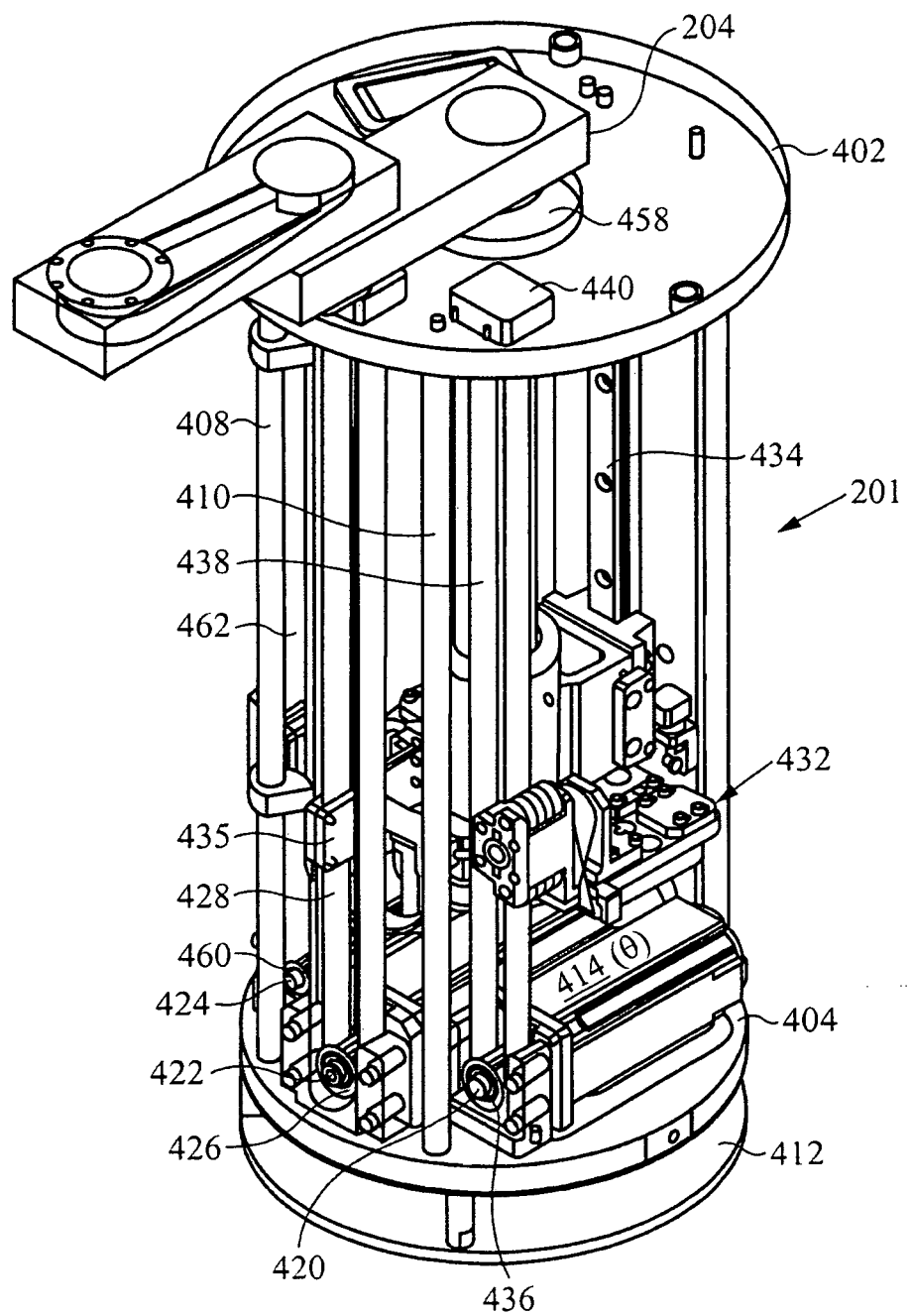
FIGS. 4-9B are perspective views showing details of the interior of the robot of FIG. 2.
Figure 5:
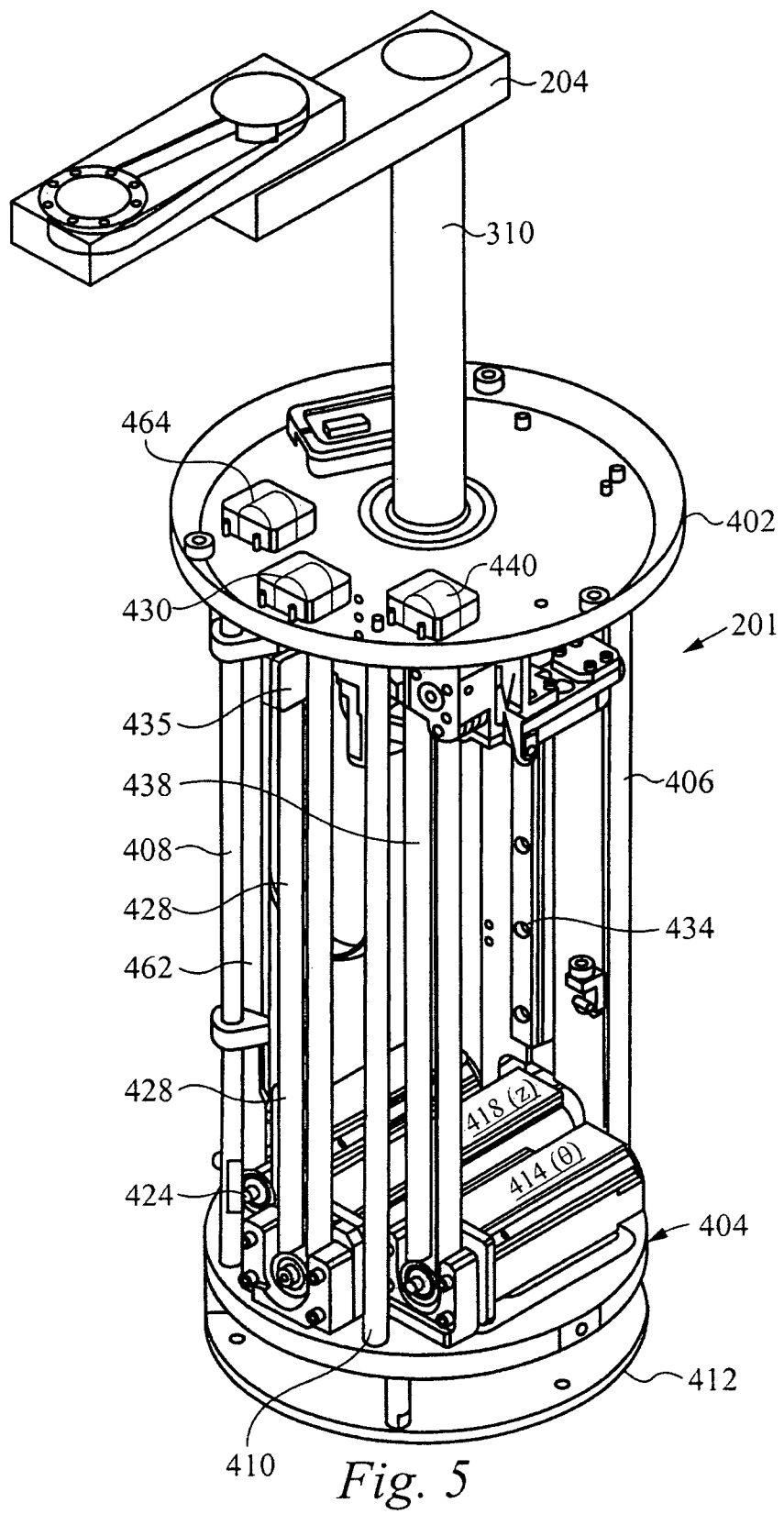
Figure 6:
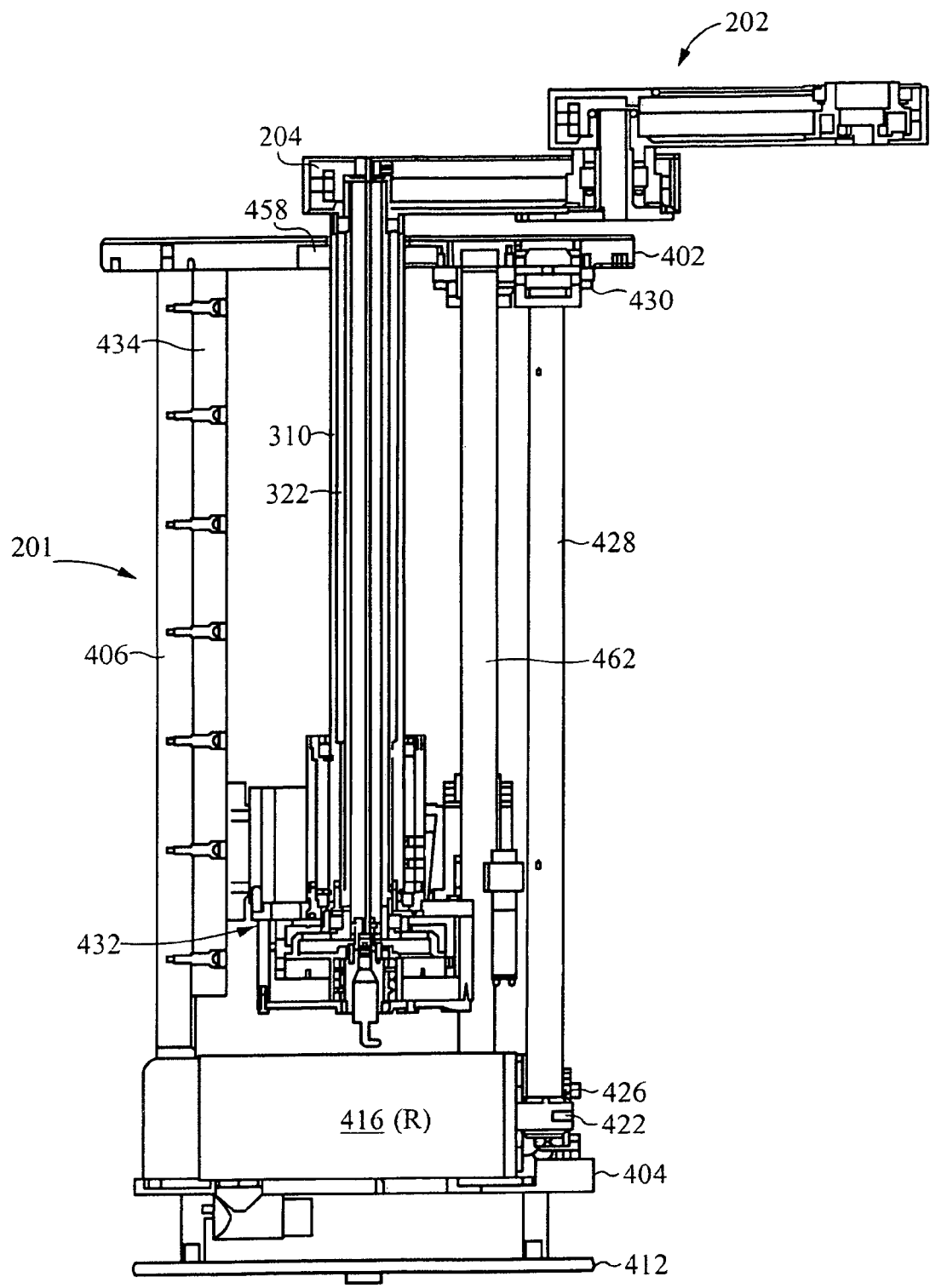
Figure 7:
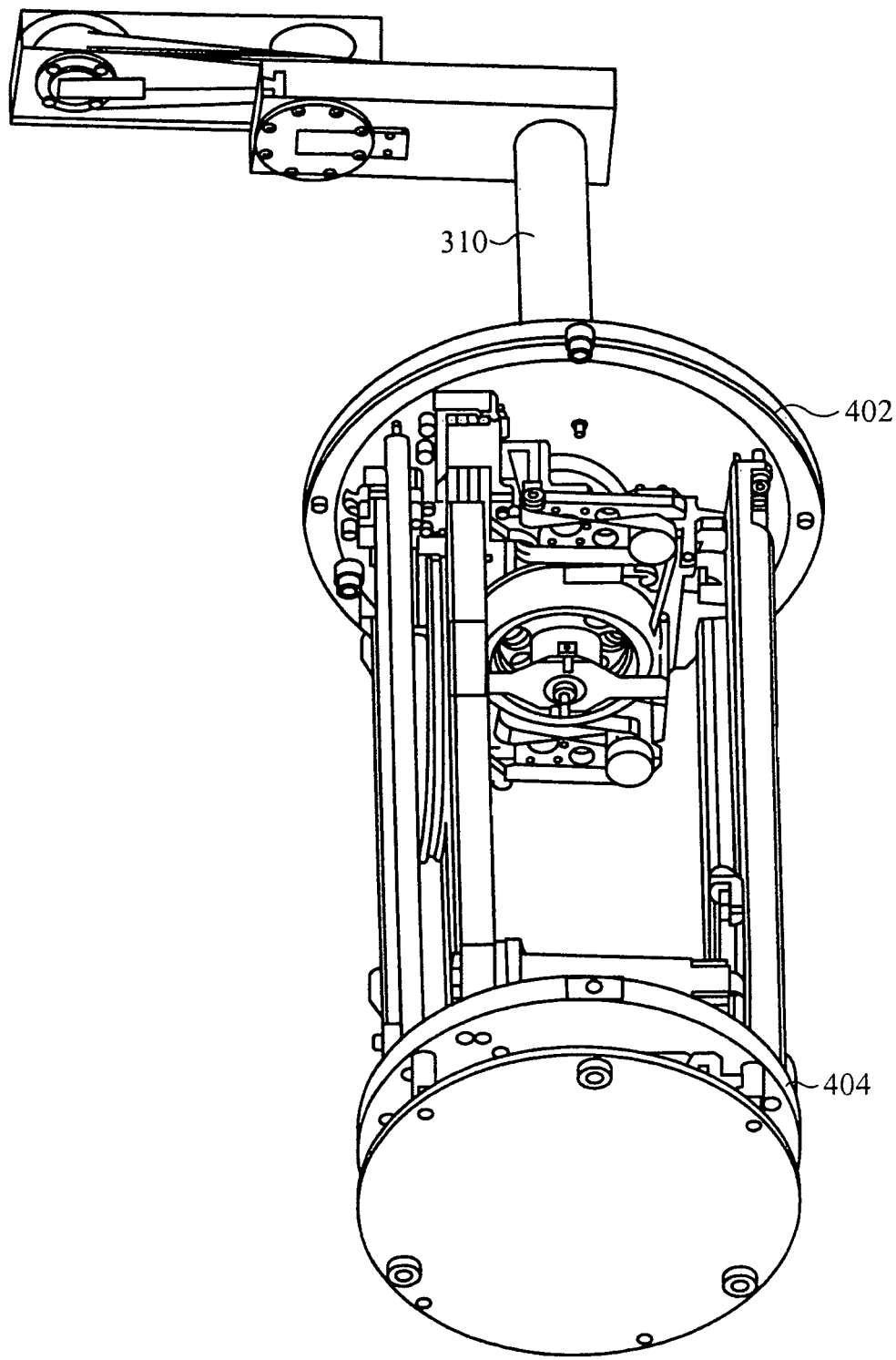
Figure 8:
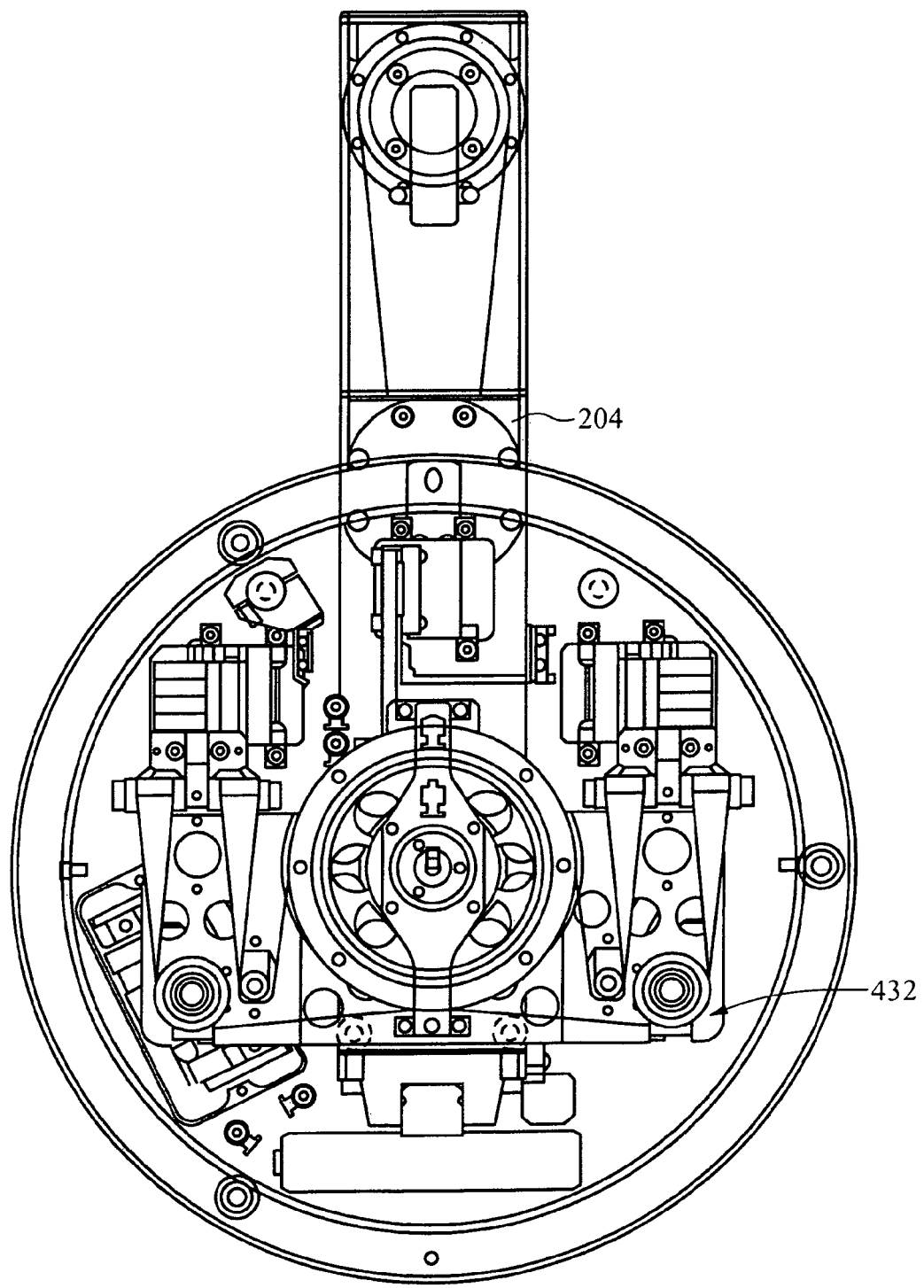

FIG. 3 is a schematic diagram illustrating details of the manner in which R and θ motions of robot arm 202 are effected. Links 204, 206 and 208 (end effector) are pivotably coupled to one another. Taking primary axis A as the point of reference, a first, outer driving shaft 310 (i.e. first shaft) is rigidly connected to the proximalmost portion of proximalmost link 204. Driving shaft 310 is centered about primary axis A and is mounted for rotation axially around said axis. Rotation of outer driving shaft 310 provides angular rotation—that is, the θ motion—of link 204 and robot arm 202. Rotation takes place bidirectionally—that is, clockwise and counter-clockwise—and is, "endless", meaning that it is not limited to a full circle but can take the form of multiple, or an "infinite" number of revolutions.

An arm radial (R) motion linkage is provided to effect radial (R) motion of the robot arm 202. The arm radial motion linkage includes a plurality of belts and pulleys coupled to the links 204-208. Motion of the plurality of belts and pulleys, including belts 312 and 314 and pulleys 316, 318 and 320, is motivated by inner driving shaft 322 (i.e. second shaft) and is coordinated such that rotation of the inner driving shaft causes retraction or extension of arm 202 in radial (R) direction. Details of radial (R) motion implementation are provided in the aforementioned U.S. Pat. No. 5,789,890.

During maneuvering of the robot arm 202, the θ and R motions are synchronized in a controlled manner for optimum performance. Synchronization takes place by controlling the rotational motions of outer driving shaft 310 and inner driving shaft 322, which can be moved independently of one another. Control and synchronization of arm 202 are effected in the spatial, velocity and acceleration and planes such that multi-segment smooth trajectories including non-radial straight line motion of the end effector 308 can be achieved. The term "non-radial" is with reference to primary axis A and means that the end effector 208 is movable in a straight line that does not pass through said primary axis. During this and other motions, the orientation of the end effector 208 can be preserved or controllably altered as desired. One manner of providing this feature is through the use of independent yaw motion of the end effector 208. It will be appreciated that the arrangement described herein is exemplary only and that other arrangements for effecting θ, R and Y motions are contemplated, including those that use different numbers of pulleys and belts, different gearing ratios, and so forth. It will also be appreciated that while the discussion herein is directed to robot arms having three links, the same principles are applicable to greater or lesser number of links and the
concepts described herein are equally applicable to such devices. Further details of the manner in which θ, R and Y motions are achieved and synchronized in a robot arm such as arm 202 can be found for example in the aforementioned U.S. Pat. No. 5,789,890.

FIGS. 4-9B are various views showing inner details of robot body 201. A portion of arm 202 excluding end effector 208 is also shown, in a first elevation in FIG. 4 and in a higher elevation in FIG. 5. Inner (322) and outer driving (310) shafts are shown in their lowest position in FIG. 4. They are also shown in a raised position in FIG. 5, such that robot arm 202 is at its lowest height or Z position in FIG. 4, and is at a higher elevation or Z position in FIG. 5.

As seen from the drawings, a frame structure is comprised of a top plate 402 and base plate 404. These are mounted substantially parallel to one another and supported by a side plate 406 and a pair of vertical supports 408 and 410. Base plate 404 may be raised above a bottom flange 412, with sufficient clearance to accommodate circuit boards or other components (not shown) if desired.

Disposed between top plate 402 and base plate 404 are three motors, 414, 416 and 418 dedicated respectively to the θ, R and Z motions exhibited by the robot 200. The motors are mounted horizontally—that is, each of their drive shafts lies substantially in a horizontal plane which is parallel to base plate 404 on which the motors are preferably mounted, and is disposed substantially perpendicularly to the primary axis A about which the inner (322) and outer (310) driving shafts are disposed. A robot body angular (θ) motion linkage, of which outer driving shaft 310 is part, transfers rotational motion of drive shaft 420 of motor 414 to proximalmost link 204 of robot arm 202 such that angular (θ) motion of the robot arm is achieved. A robot body radial (R) motion linkage, of which inner driving shaft 322 is part, transfers rotational motion of drive shaft 422 of motor 416 to the arm radial motion linkage such that radial (R) motion of robot arm 202 is achieved. A Z motion linkage transfers rotational motion of drive shaft 424 of motor 418 to axial motion of inner (322) and outer (310) driving shafts such that Z motion of arm 202 attached thereto is achieved.

The Z motion linkage includes a first drive pulley 426 coupled for rotation with drive shaft 424 of motor 418. Either direct drive or a geared drive of pulley 426 by drive shaft 424 is contemplated. Drive pulley 426 is geared, or toothed, and engages with and rotates timing belt 428 which extends between drive pulley 426 and driven idler pulley (also toothed or geared) 430 mounted to the bottom-facing portion of top plate 402. Timing belt 428 is thus stationarily mounted in robot body 201, meaning that even though it rotates, its position in the robot body does not change. Timing belt 428 (i.e. additional belt) is provided with teeth on the interior face thereof, said teeth engaging the teeth of drive pulley 426 and the teeth of driven idler pulley 430 to minimize relative slippage between the timing belt and the pulleys. As an alternative to a belt, which is preferably made of Kevlar™ or other minimal stretch material, a stainless steel band having suitable slots or holes for engaging appropriately-configured teeth on drive pulley 426 and idler pulley 430 can be used. Timing belt 428 is kept in tension to minimize slack. To provide adjustment of this tension, vertical adjustment of the position of drive pulley 426 and/or of idler pulley 430 can be provided, using a suitable adjustment mechanism, such as set screws (not shown) or the like. Moving one or both the drive pulley 426 and/or of idler pulley 430 pulleys apart increases the tension of belt 428, and moving them closer together reduces tension. In the preferred direct drive case, moving drive pulley 426 may entail moving the motor 418 and shaft 424 on which the drive pulley is mounted. This can be accomplished in a simple manner using set screws (not shown) or the like for instance.

A floating Z platform 432 supporting coaxial or nested driving shafts 310 and 322 is provided. Floating Z platform 432 is movable vertically (up-down) and is guided in said motion by a linear guide 434 provided on support plate 406. The guide serves to limit motion of floating Z platform 432 to a single direction—the Z direction. Motion of Z platform 432 is tied to that of timing belt 428. This is accomplished by providing a clamp 435 or similar connection mechanism which is rigidly attached to Z platform 432 and which is clamped to timing belt 428 such that it is immovable relative to the belt. It will be appreciated that clamp 435 should be clamped to a portion of timing belt 428 that exhibits Z (up-down) motion, but that the configuration of the timing belt can be different from that shown. In other words, timing belt 428 can have more than the two legs (428a, 428b) shown (FIG. 9A), and these legs do not all have to extend vertically or even be in the same plane, so long as at least a portion of one leg extends vertically, to which portion the clamp 435 should be coupled. When motor 418 is actuated, it rotates drive pulley 426, which moves timing belt 428, thereby vertically moving Z platform 432 clamped thereto. This causes shafts 310 and 322 to move vertically, and, commensurately, arm 202 coupled to the upper portions of the shafts. Because the motors 414, 416 and 418 are disposed at the bottom of the interior region of robot body 201 and are preferably side by side and arranged such that they are parallel to and close to the base plate 404, they provide clearance for Z platform 432, allowing its descent unimpeded towards the bottom of the robot body 201. This allows for a vertically more compact robot body and/or more Z travel for robot arm 202.

Figure 10:
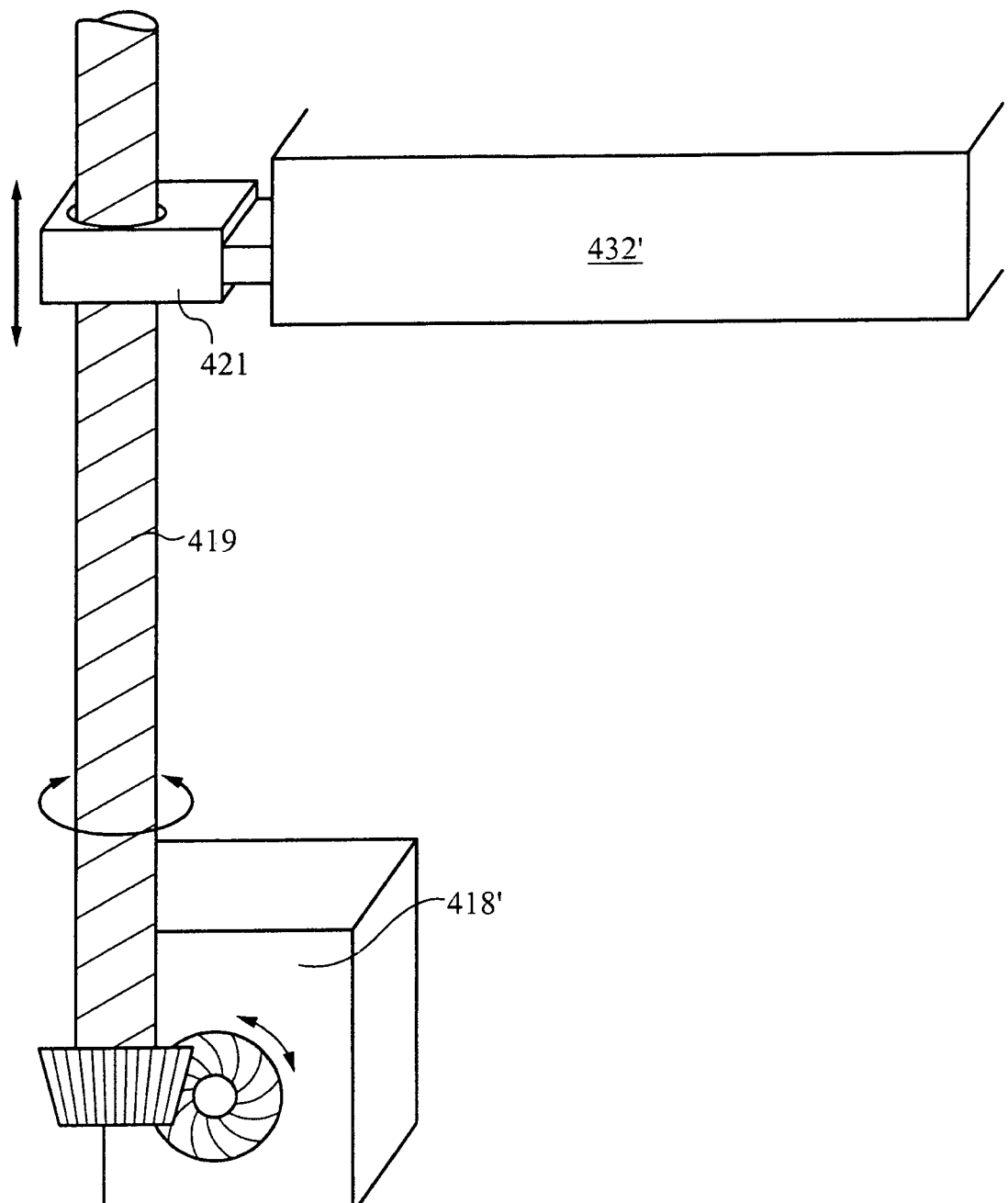
FIG. 10 is a schematic view of an alternative Z motion linkage using a threaded rod and engaged threaded nut.
Figure 11:
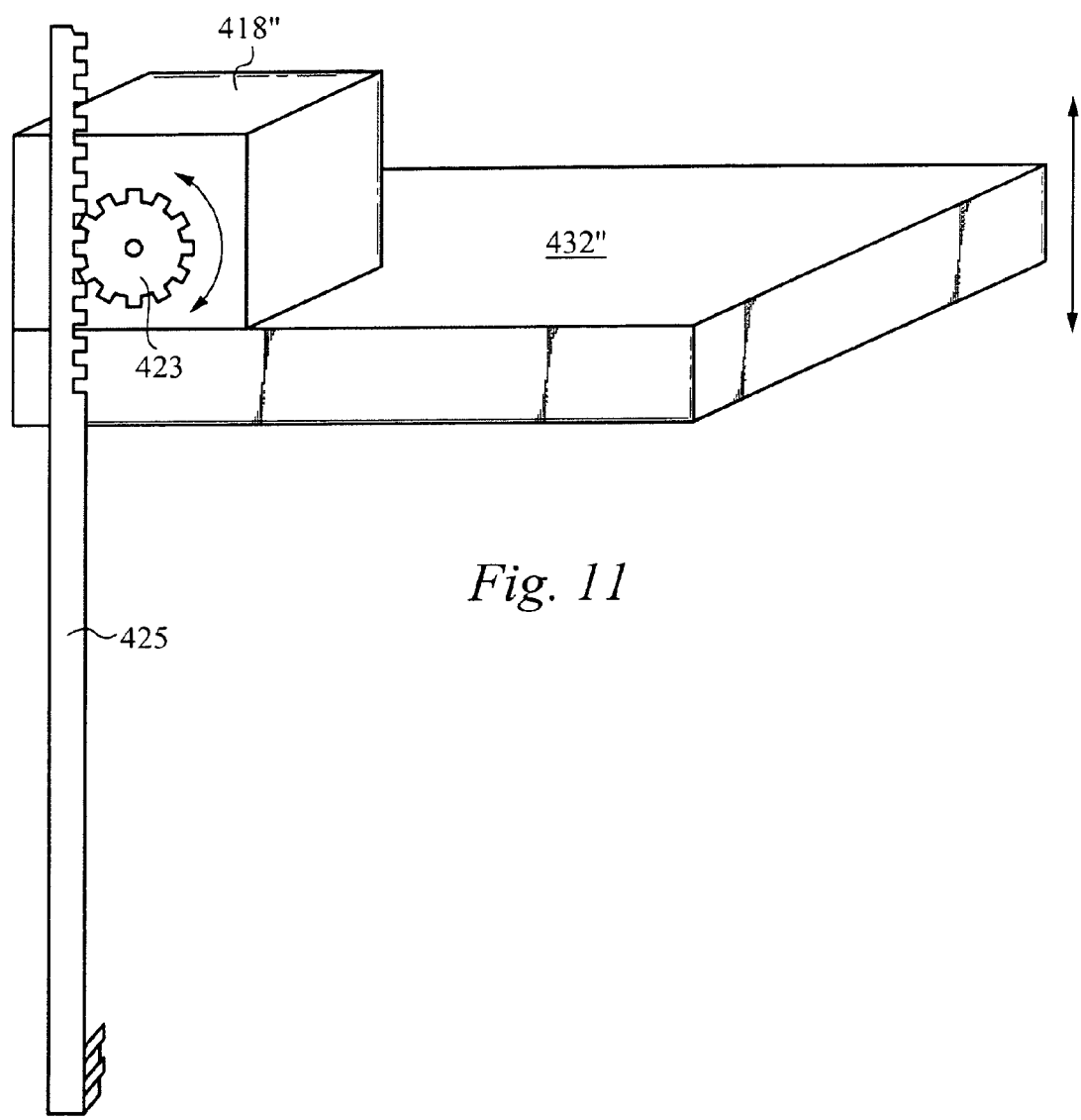
FIG. 11 is a schematic view of an alternative Z motion linkage using a rack and pinion arrangement.

It will be appreciated that in other embodiments the Z motion linkage can be a means for motivating the Z platform in the Z direction other than timing belt 432 and clamp 435. Instead, a screw-type mechanism can be used, as shown in FIG. 10, in which a motor 418' rotates a vertically mounted threaded rod 419 which engages threaded nut 421 rigidly mounted to the floating Z platform 432'. Alternatively, a rack-and-pinion arrangement as shown in FIG. 11 can be used, wherein a motor 418" mounted in floating Z platform 432" rotates a pinion 423 which engages a toothed rack 425, imparting Z motion to the floating Z platform on which the motor and pinion are mounted.

The robot body angular (θ) motion linkage includes a first drive pulley 436 coupled for rotation with drive shaft 420 of motor 414. Again, either direct drive or a geared drive is contemplated. Drive pulley 436 is geared, or toothed, and serves to rotate a primary timing belt 438 which extends between drive pulley 436 and driven idler pulley (also toothed or geared) 440 mounted to the bottom-facing portion of top plate 402. Primary timing belt 438 is thus stationarily mounted in robot body 201, meaning that even though it rotates, its position in the robot body does not change. Primary timing belt 438 is provided with teeth on the interior face thereof, these teeth engaging the teeth of drive pulley 436 and driven idler pulley 440 to minimize relative slippage of the timing belt and pulleys. As an alternative to a belt, which is preferably made of Kevlar™ or other minimal-stretch material, a stainless steel band having suitable slots or holes for engaging appropriately-configured teeth on drive pulley 436 and idler pulley 440 can be used. Primary timing belt 438 is kept in tension to minimize slack. To provide adjustment of this tension, the position of drive pulley 436 and/or of idler pulley 440 can be adjusted vertically. Moving one or both of these pulleys apart increases the tension of belt 438, and moving them towards one another reduces the tension. Of course, in the preferred direct drive case, moving drive pulley 436 entails moving the motor 414 and shaft 420 on which the drive pulley is mounted. This can be accomplished in a simple manner using set screws (not shown) for instance.

An angular (θ) motion conversion assembly is mounted to floating Z platform 432 and coupled to primary timing belt 438. The angular (θ) motion conversion assembly includes a driving (442) and a driven (444) pulley (FIG. 9A) that are axially coupled to one another such that rotation of driving pulley 442 causes rotation of driven pulley 444. The pulleys 442 and 444 are toothed, with the teeth of driving pulley 442 engaging the teeth of primary timing belt 438. Guiding wheels 446 and 448 provided on either side of driving pulley 442 serve to bias the driving pulley against primary timing belt 438 for proper engagement therewith. The teeth of driven pulley 444 engage the teeth of a secondary timing belt 450 which is coupled to outer driving shaft 310 by way of a large, toothed pulley 452 mounted axially to the base of the driving shaft (FIG. 9C). As an alternative to a belt, which is preferably made of Kevlar™ or other minimal stretch material, a stainless steel band having suitable slots or holes for engaging appropriately-configured teeth on driven pulley 444 and large pulley 452 can be used. Secondary timing belt 450 has a 90-degree "folded" configuration such that rotation of pulleys 442 and 444 in a first (horizontal) axis is converted to rotation of outer driving shaft 310 in a second (vertical) axis. Folding is effected using an arrangement of freely rotating pins or wheels 454, optionally in combination with toothed pulleys 456, around which the secondary timing belt 450 is directed to achieve the desired directional changes. Large pulley 452 is rotationally mounted in floating Z platform 432 and is rigidly connected to the base of outer driving shaft 310 such that its rotational motion is caused by secondary timing belt 450. (See FIG. 9C). Shaft 310 (and shaft 322) passes through top plate 402 and is free to rotate and slide axially (up-down) therein. A bearing 458 in top plate 402 facilitates this. Axial (up-down) motion of outer shaft 310 is coupled to axial motion of inner shaft 322 disposed therein such that the two shafts move axially (Z motion) together along the robot primary axis. However, rotational motion of the two shafts is independent—that is, the two shafts may simultaneously or alternately rotate in the same direction at the same or different rates, or they may rotate in opposite directions at the same or different rates. Suitable bearings (not shown) are provided to ensure this. The two shafts 310 and 322 are therefore rotationally independent of one another. It will be appreciated that driving pulley 442 of the angular (θ) motion conversion assembly should couple to a portion of primary timing belt 438 that extends in the Z (up-down) direction commensurately with the travel of the floating Z platform 432 to which the angular (θ) motion conversion assembly is mounted, but that the configuration of the primary timing belt can be different from that shown. In other words, the primary timing belt 438 can have more than the two legs (438a, 438b) shown (FIG. 9A), and these legs do not all have to extend vertically or even be in the same plane, so long as at least a portion of one leg extends vertically to the same extent as the travel of the floating Z platform 432.

The robot body radial (R) motion linkage includes a first drive pulley 460 coupled for rotation with drive shaft 422 of motor 416. Again, either direct drive or a geared drive is contemplated. Drive pulley 460 is geared, or toothed, and serves to rotate a primary timing belt 462 which extends between drive pulley 460 and driven idler pulley (also toothed or geared) 464 mounted to the bottom-facing portion of top plate 402. Primary timing belt 462 is thus stationarily mounted in robot body 201, meaning that even though it rotates, its position in the robot body does not change. Primary timing belt 462 is provided with teeth on the interior face thereof, these teeth engaging the teeth of drive pulley 460 and driven idler pulley 464 to minimize relative slippage of the timing belt and pulleys. As an alternative to a belt, which is preferably made of Kevlar™ or other minimal-stretch material, a stainless steel band having suitable slots or holes for engaging appropriately-configured teeth on drive pulley 460 and idler pulley 464 can be used. Primary timing belt 462 is kept in tension to minimize slack. To provide adjustment of this tension, the position of drive pulley 460 and/or of idler pulley 464 can be adjusted vertically. Moving one or both of these pulleys apart increases the tension of belt 462, and moving them towards one another reduces the tension. Of course, in the preferred direct drive case, moving drive pulley 460 entails moving the motor 416 and shaft 422 on which the drive pulley is mounted. This can be accomplished in a simple manner using set screws (not shown) for instance.

Figure 9A:
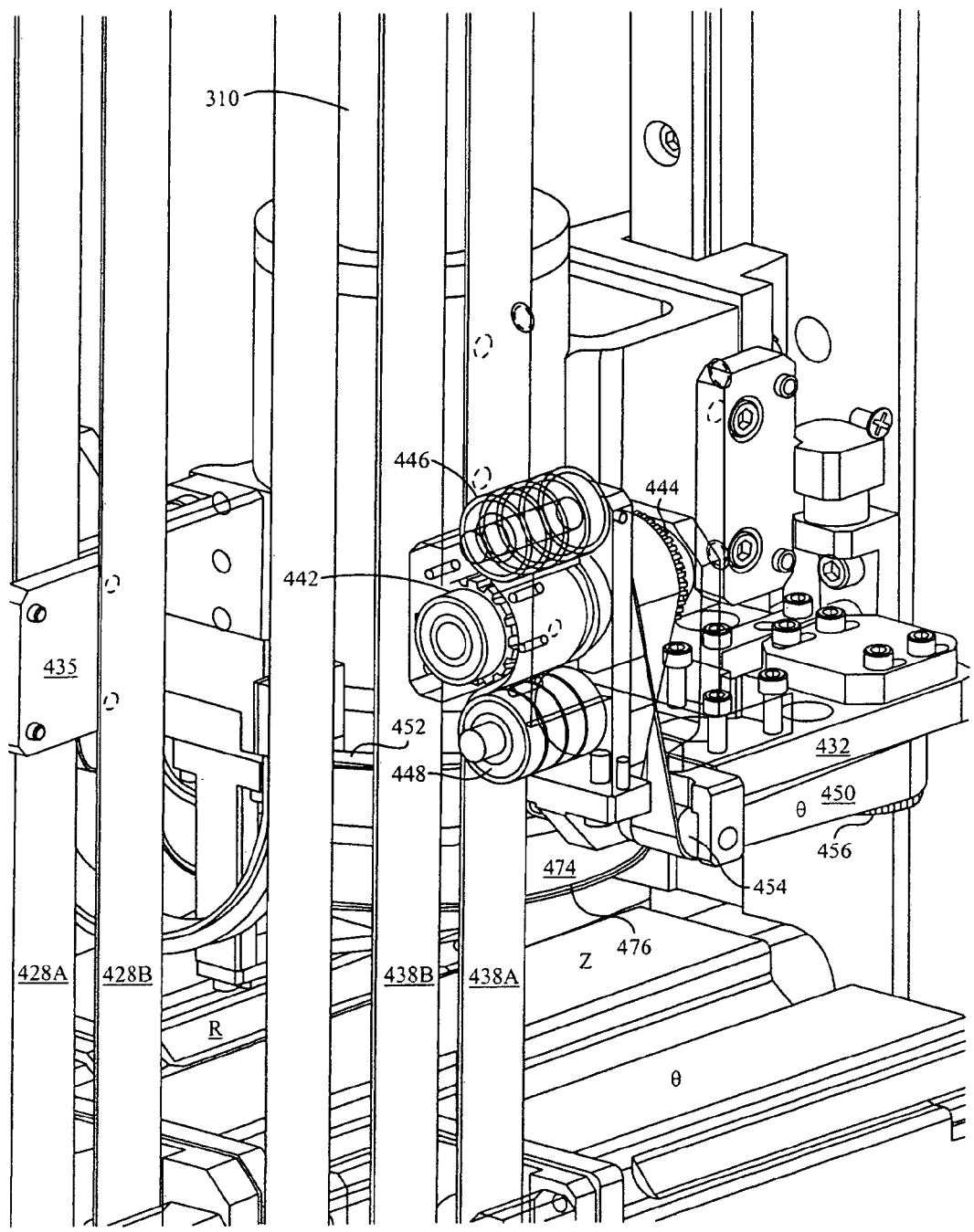
FIG. 9C is a schematic view showing the connection of the coaxial shafts to the respective large pulleys driven by the secondary timing belts.
Figure 9B:
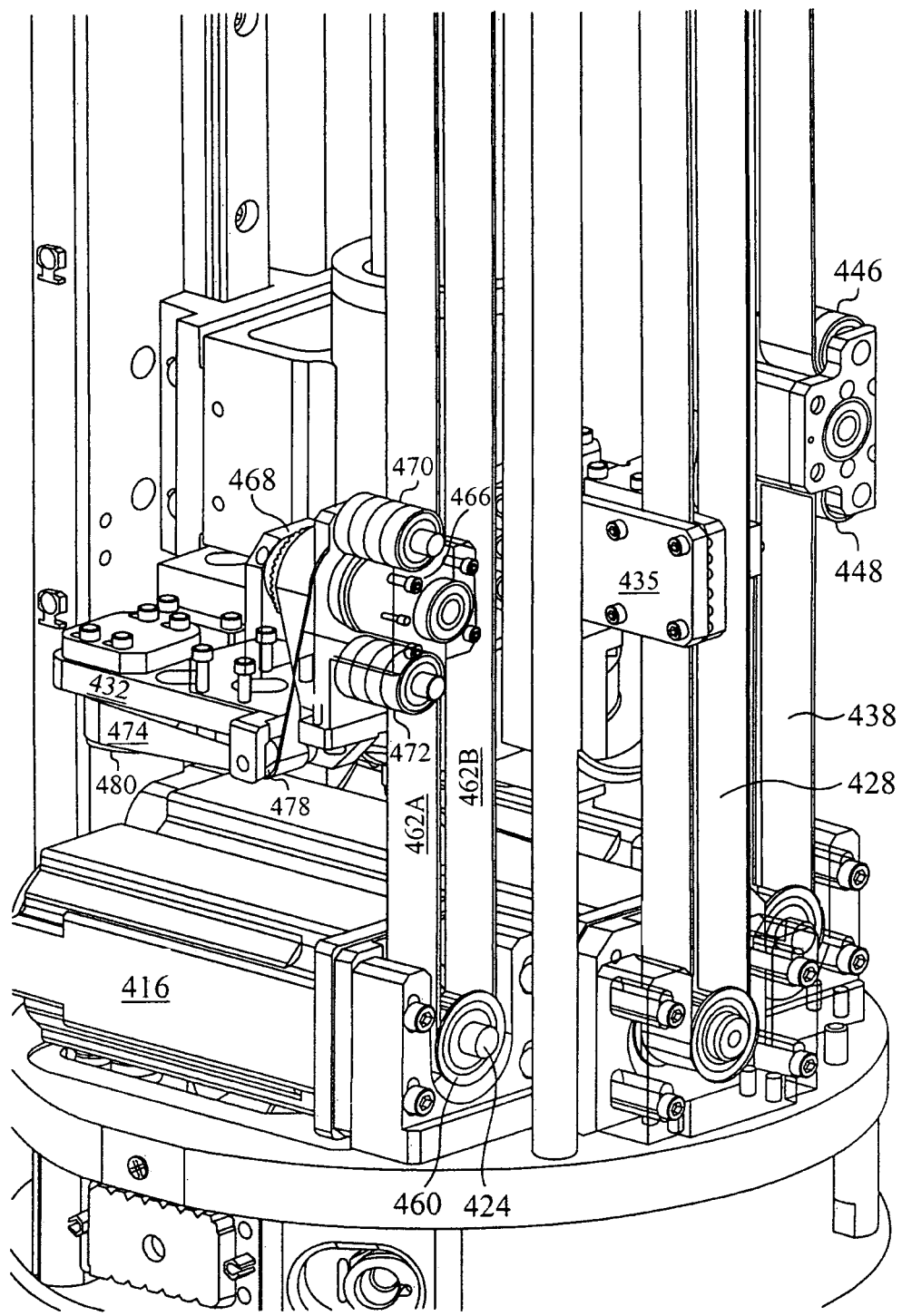
Figure 9C:
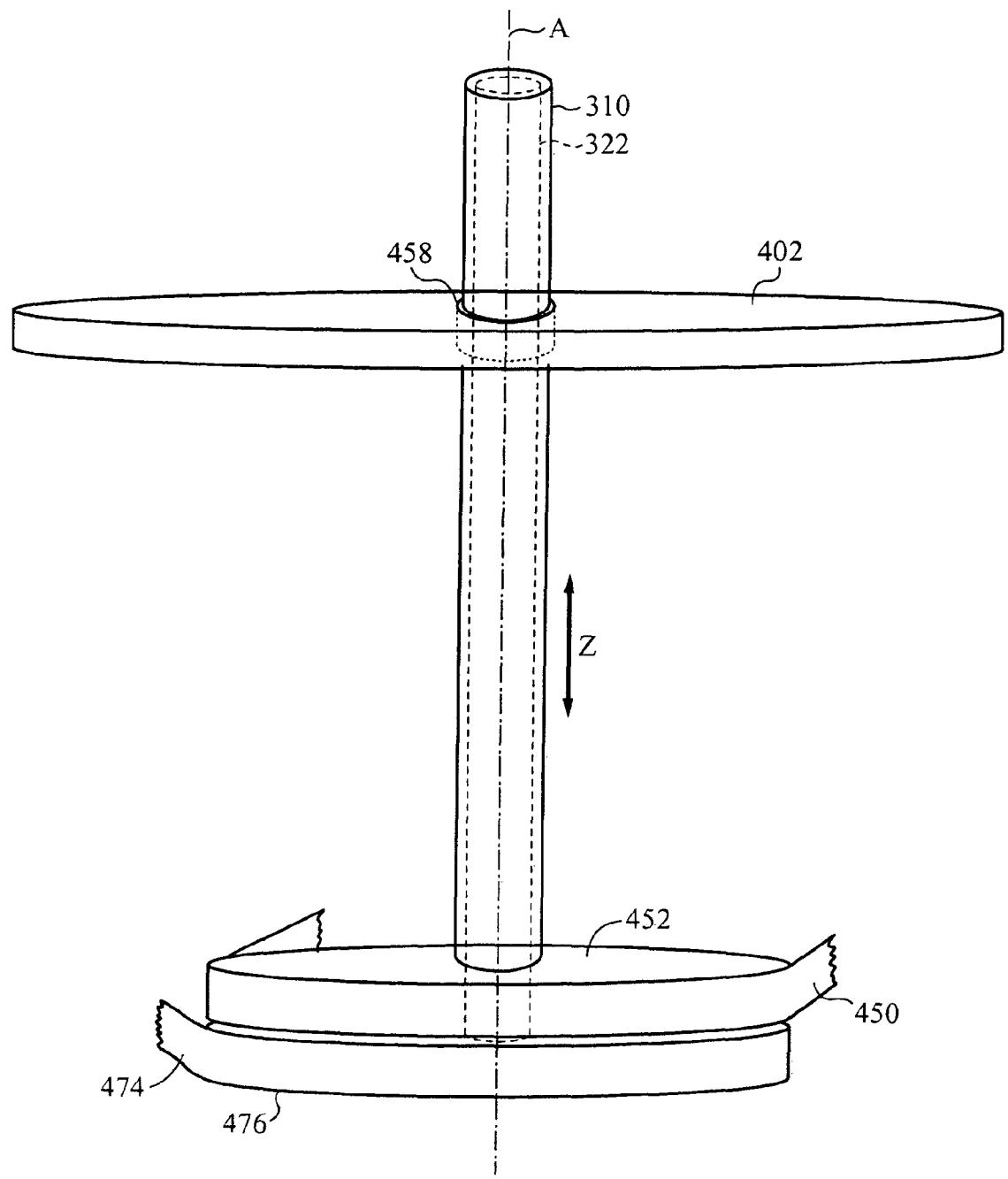

A radial (R) motion conversion assembly (i.e. additional motion conversion assembly) is mounted to floating Z platform 432 and coupled to primary timing belt 462 (i.e. additional timing belt), as detailed in FIG. 9B. The radial (R) motion conversion assembly includes a driving (466) and a driven (468) pulley (i.e. additional driving pulley and driven pulley) that are axially coupled to one another such that rotation of driving pulley 466 causes rotation of driven pulley 468. The pulleys 466 and 468 are toothed, with the teeth of driving pulley 466 engaging the teeth of primary timing belt 462. Guiding wheels 470 and 472 provided on either side of driving pulley 466 serve to bias the driving pulley against primary timing belt 462 for proper engagement therewith. The teeth of driven pulley 468 engage the teeth of a secondary timing belt 474 (i.e. additional secondary timing belt) which is coupled to inner driving shaft 322 by way of a large, toothed pulley 476 attached axially to the base of the driving shaft (FIG. 9C). As an alternative to a belt, which is preferably made of KEVLAR™ or other minimal stretch material, a stainless steel band having suitable slots or holes for engaging appropriately-configured teeth on driven pulley 468 and large pulley 476 can be used. Secondary timing belt 474 has a 90-degree "folded" configuration such that rotation of pulleys 466 and 468 in a first (horizontal) axis is converted to rotation of inner driving shaft 322 in a second (vertical) axis. Folding is effected using an arrangement of freely rotating pins or wheels 478, optionally in combination with toothed pulleys 480, around which the secondary timing belt 474 is directed to achieve the desired directional changes. Large pulley 476 is rotationally mounted in floating Z platform 432 below and coaxially with large toothed pulley 452 and is rigidly connected to the base of inner driving shaft 322 such that its rotational motion caused by secondary timing belt 474 is transferred to rotation of the inner shaft. Inner shaft 322 is nested in outer shaft 310, both of which pass through top plate 402 and are free to rotate and slide axially (up-down) therein. A bearing 458 in top plate 402 between the plate and outer driving shaft 310 facilitates this, along with a bearing between the shaft to facilitate their rotation independently of one another. As stated above, independent rotational motion of the shafts means that the two shafts may simultaneously or alternately rotate in the same direction at the same or different rates, or they may rotate in opposite directions at the same or different rates. It will be appreciated that driving pulley 466 of the radial (R) motion conversion assembly should couple to a portion (462*a*, 462*b*) of primary timing belt 462 that extends in the Z (up-down) direction commensurately with the travel of the floating Z platform 432 to which the radial (R) motion conversion assembly is mounted, but that the configuration of the primary timing belt 462 can be different from that shown. In other words, the primary timing belt 462 can have more than the two legs 462*a*, 462*b* shown, and these legs do not all have to extend vertically or even be in the same plane, so long as at least a portion of one leg extends vertically to the same extent as the travel of the floating Z platform 432.

The arrangement detailed above provides the robot 200 with motion along three axes—R, θ and Z. That is, robot 200 is thus provided with three degrees of freedom. Moreover, angular (θ) motion is unrestricted, meaning that an "endless" number of revolutions of robot arm 202 is possible, with no cables or other mechanical encumbrances preventing rotations of greater than 360 degrees. In addition, other degrees of freedom, including yaw (Y), pitch and roll of the end effector 208 are possible, in accordance with principles described in the aforementioned U.S. Pat. No. 5,789,890, entitled "ROBOT HAVING MULTIPLE DEGREES OF FREEDOM (Genov et al.)

It will be appreciated that because of the manner in which the robot body angular (θ) motion linkage and the robot body radial (R) motion linkage are coupled to the Z motion linkage, Z motion must be synchronized with angular (θ) and radial (R) motions. For instance, consider the case in which only Z motion is desired, and the angular (θ) and radial (R) positions of the robot arm 202 are to remain unchanged—that is, no angular (θ) or radial (R) motions are to occur. As floating Z platform 432 is raised or lowered by action of motor 418 and timing belt 428, motors 414 and 416 must also be actuated so that no relative motion between primary timing belt 438 and driving pulley 442 of the angular (θ) motion conversion assembly takes place, and also so that no relative motion between primary timing belt 462 and driving pulley 466 of the radial (R) motion conversion assembly takes place, because such relative motions would cause angular (θ) or radial (R) displacement of robot arm 202. In the case of the floating Z platform 432 being raised, motors 414 and 416 would need to be actuated in a first direction, and in the case of floating Z platform 432 being lowered, motors 414 and 416 would need to be actuated in a second, opposite direction. Consider also the case in which only angular (θ) motion is desired. This would require activation of motor 414 only. Similarly, if only radial (R) motion is desired, only motor 416 need be activated.

Figure 12:
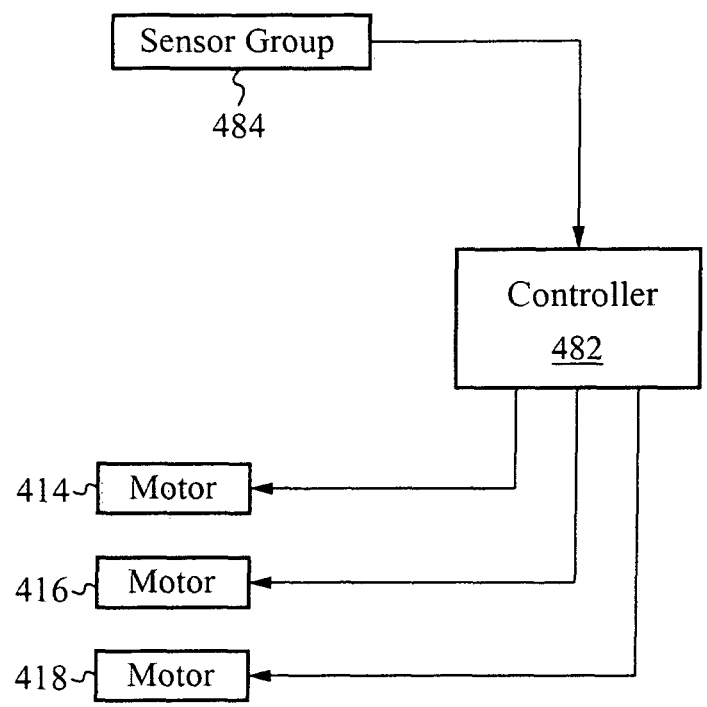
FIG. 12 is a block diagram showing the controller and related components for controlling the robot of FIG. 2.

It will be noted that in practice, during translation of floating Z platform 432 in the Z direction, relative motion between primary timing belt 438 and driving pulley 442 of the angular (θ) motion conversion assembly, along with relative motion between primary timing belt 462 and driving pulley 466 of the radial (R) motion conversion assembly, may in fact be desired, so that motion of the robot arm 202 can take place in multiple degrees of freedom simultaneously, in order shorten or optimize trajectories and travel times and thereby increase robot speed and performance. The relative motions can take place at different rates and in opposite directions depending on the desired trajectory, and actuation of motors 414, 416 and 418 can be controlled accordingly. Of course all motor actuation is provided by a controller which is programmable such that it causes actuation of the motors in any fashion necessary to achieve the desired trajectories of robot arm 202. This is illustrated in FIG. 12, which shows that the controller 482 provides actuation signals to the motors 414, 416, and 418. The controller operates at least in part based on sensor signals from sensor group 484. The sensor signals derive from one or more sensors (not shown) which determine for example the positions of various robot components using devices such as encoders and so forth. In this manner controller 482 is provided with feedback according to which it issues the actuation signals to the motors. The controller 482 may be external to the robot 200 or internal thereto, or it may be partially external such that some components thereof are external, and partially internal such that other components thereof are internal.

The above are exemplary modes of carrying out the invention and are not intended to be limiting. It will be apparent to those of ordinary skill in the art that modifications thereto can be made without departure from the spirit and scope of the invention as set forth in the following claims.

The invention claimed is:

1. An assembly comprising:
   a platform configured for motion in a first direction;
   a first shaft extending in the first direction and supported by the platform for axial translation in the first direction;
   a primary timing belt having a first portion that is movable in the first direction; and a motion conversion assembly including:
      a driving pulley rotatable by the first portion of the primary timing belt; and
      a secondary timing belt coupled to the first shaft and driven by the driving pulley such that rotation of the driving pulley caused by motion of the first portion of the primary timing belt in the first direction imparts axial rotation of the first shaft;
   a second shaft extending in the first direction and supported by the platform for axial translation in the first direction;
   an additional primary timing belt having a first portion that is movable in the first direction; and
   an additional motion conversion assembly including:
      an additional driving pulley rotatable by the first portion of the additional primary timing belt; and
      an additional secondary timing belt coupled to the second shaft and driven by the additional driving pulley such that rotation of the additional driving pulley caused by motion of the first portion of the additional primary timing belt in the first direction imparts axial rotation of the second shaft.

2. The assembly of claim 1, further comprising:
   an additional belt having a first portion movable in the first direction, the platform being coupled to the first portion of the additional belt for motion therewith in the first direction.

3. The assembly of claim 1, further comprising:
a robot arm coupled to the first shaft, wherein axial rotation of the first shaft imparts angular ($\theta$) motion to the robot arm.

4. The assembly of claim 1, further comprising:
a robot arm coupled to the first shaft, wherein axial rotation of the first shaft imparts radial (R) motion to the robot arm.

5. The assembly of claim 1, further comprising:
a robot arm coupled to the first and second shafts, wherein axial rotation of the first shaft imparts angular ($\theta$) motion to the robot arm, and axial rotation of the second shaft imparts radial (R) motion to the robot arm.

6. The assembly of claim 3, wherein the robot arm includes a plurality of pivotably coupled links, the proximalmost of said links being mounted for rotation about the first direction to thereby provide said angular ($\theta$) motion.

7. The assembly of claim 4, wherein the robot arm includes a plurality of pivotably coupled links and an arm radial motion linkage configured to transfer rotation of said first shaft to the distalmost link to thereby provide said radial (R) motion.

8. The assembly of claim 5, wherein the robot arm includes a plurality of pivotably coupled links, the proximalmost of said links being mounted for rotation about the first direction to thereby provide said angular ($\theta$) motion.

9. The assembly of claim 5, wherein the robot arm includes a plurality of pivotably coupled links and an arm radial motion linkage configured to transfer rotation of one of the first or second shafts to the distalmost link to thereby provide said radial (R) motion.

10. A robot comprising:
a platform configured for motion in a first direction;
a first shaft extending in the first direction and supported by the platform for axial translation in the first direction;
a robot arm coupled to the first shaft for motion therewith in the first direction;
a primary timing belt having a first portion that is movable in the first direction; and
a motion conversion assembly including:
   a driving pulley rotatable by the first portion of the primary timing belt; and
   a secondary timing belt coupled to the first shaft and driven by the driving pulley such that rotation of the driving pulley caused by motion of the first portion of the primary timing belt in the first direction imparts axial rotation of the first shaft, the axial rotation imparting to the robot arm one of angular ($\theta$) or radial (R) motions;
a second shaft extending in the first direction and supported by the platform for axial translation in the first direction;
an additional primary timing belt having a first portion that is movable in the first direction; and
an additional motion conversion assembly including:
   an additional driving pulley rotatable by the first portion of the additional primary timing belt; and
   an additional secondary timing belt coupled to the second shaft and driven by the additional driving pulley such that rotation of the additional driving pulley caused by motion of the first portion of the additional primary timing belt in the first direction imparts axial rotation of the second shaft, the axial rotation imparting to the robot arm the other of the angular ($\theta$) or radial (R) motions.

11. The robot of claim 10, further comprising:
an additional belt having a first portion movable in the first direction, the platform being coupled to the first portion of the additional belt for motion therewith in the first direction.

12. The robot of claim 10, wherein the robot arm includes a plurality of pivotably coupled links, the proximalmost of said links being mounted for rotation about the first direction to thereby provide said angular ($\theta$) motion.

13. The robot of claim 10, wherein the robot arm includes a plurality of pivotably coupled links and an arm radial motion linkage configured to transfer rotation of said first shaft to the distalmost link to thereby provide said radial (R) motion.

14. The robot of claim 10, wherein the robot arm includes a plurality of pivotably coupled links, the proximalmost of said links being mounted for rotation about the first direction to thereby provide said angular ($\theta$) motion.

15. The robot of claim 10, wherein the robot arm includes a plurality of pivotably coupled links and an arm radial motion linkage configured to transfer rotation of one of said first or second shafts to the distalmost link to thereby provide said radial (R) motion.

* * * * *